US006346906B1

United States Patent
Nakaigawa

(10) Patent No.: US 6,346,906 B1
(45) Date of Patent: Feb. 12, 2002

(54) THERMOMETRIC-BINARY CODE CONVERSION METHOD, CONVERSION CIRCUIT THEREFOR AND ENCODER ELEMENT CIRCUITS USED THEREFOR

(75) Inventor: Sachio Nakaigawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/422,330

(22) Filed: Oct. 21, 1999

(30) Foreign Application Priority Data

Oct. 21, 1998 (JP) .......................................... 10-299532

(51) Int. Cl.[7] .............................................. H03M 1/36
(52) U.S. Cl. ........................................ 341/160; 341/64
(58) Field of Search ............................ 341/50, 160, 56, 341/64, 118, 159, 158, 96, 97, 94; 340/347

(56) References Cited

U.S. PATENT DOCUMENTS

| 4,586,025 A | * | 4/1986 | Knierim | ...................... 340/347 |
| 4,733,220 A | * | 3/1988 | Knierim | ...................... 340/347 |
| 4,983,968 A | * | 1/1991 | Nguyen | ...................... 341/118 |
| 5,382,955 A | * | 1/1995 | Knierim | ...................... 341/64 |
| 5,602,499 A | | 2/1997 | Shou et al. | ...................... 327/75 |

FOREIGN PATENT DOCUMENTS

| FR | 2 156 621 | 6/1973 | ................. 374/121 |
| JP | 52-18880 | 8/1993 | |
| JP | 7-95089 | 4/1995 | |
| JP | 7-095089 | 4/1995 | |
| JP | 8-36466 | 2/1996 | |
| JP | 8-036466 | 2/1996 | |

\* cited by examiner

*Primary Examiner*—Peguy JeanPierre
*Assistant Examiner*—Joseph Lauture
(74) *Attorney, Agent, or Firm*—Young & Thompson

(57) ABSTRACT

A thermometric-binary code conversion circuit 201 including an input unit 202 that outputs an encode input signal upon receiving a thermometric input signal. An encoder unit 204 outputs an encoded output signal upon receiving an encode input signal. An output unit 203 outputs a binary output signal upon receiving the encoded output signal. The encoder unit directly converts the code in accordance with a thermometric-binary code conversion equation expressed by Boolean algebra without forming intermediate code and without having dependence among bits of the binary output signal.

29 Claims, 14 Drawing Sheets

Fig.2 PRIOR ART

| INPUT OF ANALOG VOLTAGE | IDEAL THERMOMETRIC CODE | NON-IDEAL THERMOMETRIC CODE | BINARY CODE |
|---|---|---|---|
| EQUAL TO LEVEL 4 (100) | 1 1 1 1 0 0 0<br>(LSB)         (MSB) | 1 1 1 0 1 0 0<br>(LSB)         (MSB) | 0 1 1 |

Fig.4

| INPUT | | | | OUTPUT | STATE OF ENCODER |
|---|---|---|---|---|---|
| A | B | C | $\overline{C}$ | X | |
| 1 | 0 | 0 | 1 | 0 | (S1) |
| 1 | 1 | 0 | 1 | 1 | |
| 0 | 0 | 0 | 1 | Z | (S2) |
| 1 | 1 | 1 | 0 | Z | |
| 0 | 1 | 0 | 1 | X | (S3) |
| 0 | 0 | 1 | 0 | X | |
| 0 | X | 1 | 0 | X | |

Z:HIGH-Z
X:DON'T CARE

| INPUT OF ANALOG VOLTAGE | IDEAL THERMOMETRIC CODE | NON-IDEAL THERMOMETRIC CODE | BINARY CODE |
|---|---|---|---|
| EQUAL TO LEVEL 4 (100) | 0 0 0 1 1 1 1<br>(MSB)　　(LSB) | 0 0 1 0 1 1 1<br>(MSB)　　(LSB) | 0 1 1 |

| Ā | B | C̄ | X̄ | STATE |
|---|---|---|---|---|
| 0 | 0 | 0 | 1 | (S3) |
| 0 | 0 | 1 | 1 | (S1) |
| 0 | 1 | 0 | High-Z | (S2) |
| 0 | 1 | 1 | 0 | (S1) |
| 1 | 0 | 0 | High-Z | (S3) |
| 1 | 0 | 1 | High-Z | (S2) |
| 1 | 1 | 0 | High-Z | (S3) |
| 1 | 1 | 1 | 0 | (S3) |

| A | B | C | X | STATE |
|---|---|---|---|---|
| 0 | 0 | 0 | High-Z | (S2) |
| 0 | 0 | 1 | High-Z | (S3) |
| 0 | 1 | 0 | 1 | (S3) |
| 0 | 1 | 1 | High-Z | (S3) |
| 1 | 0 | 0 | 0 | (S1) |
| 1 | 0 | 1 | 0 | (S3) |
| 1 | 1 | 0 | 1 | (S1) |
| 1 | 1 | 1 | High-Z | (S2) |

Fig. 17

| DECIMAL CODE | IDEAL THERMOMETRIC CODE<br>(MSB)        (LSB) | NON-IDEAL THERMOMETRIC CODE<br>(MSB)        (LSB) | BINARY CODE AFTER CONVERSION | ERROR (DECIMAL VALUE) |
|---|---|---|---|---|
| 0 | 00000000 | | | |
| 1 | 00000001 | 00000001 | 001 | +1 |
| 2 | 00000011 | 00000010 | 010 | +1 |
| 3 | 00000111 | 00000101 | 001 | -1 |
| 4 | 00001111 | 00001011 | 100 | +1 |
| 5 | 00011111 | 00010111 | 011 | -1 |
| 6 | 00111111 | 01011111 | 110 | +1 |
| 7 | 01111111 | 10111111 | 101 | -1 |
|   | 11111111 | 01111111 | 110 | -1 |

THERMOMETRIC-BINARY CODE CONVERSION METHOD, CONVERSION CIRCUIT THEREFOR AND ENCODER ELEMENT CIRCUITS USED THEREFOR

BACKGROUND OF THE INVENTION

The present invention relates to an encoder circuit for converting a thermometric code into a binary code and, particularly, to an improved encoder circuit for converting the thermometric code into the binary code at a high speed and directly.

As is well known, an analog-digital (hereinafter abbreviated as A/D) converter is a device that converts an analog signal into a digital signal. There have heretofore been known A/D converters of a variety of kinds. Among them, a flush A/D converter features a short conversion time since it effects a comparison operation only a single time. In the flush A/D converter, a reference voltage is divided into a plurality of voltages by a plurality of resistors, voltages at dividing points are compared with a voltage of an analog input signal at the same time, and an address of the dividing point having a voltage closest to the voltage of the analog input signal is output as a digital signal. Therefore, comparators are required in a number equal to the number of the dividing points, resulting in an increase in the scale of the circuit.

The flush A/D converter requires a code converter for converting the code delivered from the above-mentioned plurality of comparators (hereinafter referred to as "comparator array") into the binary code. In the case of an N-bit flush A/D converter, the output of the comparator array if the code having a $(2^N-1)$-bit length. This code is a digital code expressing the voltage of an analog voltage signal, which, in this field of art, is called "thermometric code" and is abbreviated as "THC". Therefore, the above code conversion circuit is called a thermometric-binary code conversion circuit. An ideal thermometric code is the one in which consecutive "1"s precede and "0"s succeed. A transition point from "1" into "0" represents the level of the analog voltage signal.

The thermometric-binary code conversion circuit of this type has been disclosed in, for example, JP-H8-36466 (hereinafter referred to as "prior art 1"). This thermometric-binary code conversion circuit employs a dichotomizing search to decrease a conversion error and, hence, converts the thermometric code directly into the binary code without forming an intermediate code.

As will be described later in detail, the thermometric-binary code conversion circuit involves problems as described below.

A first problem is that the rate of conversion decreases in proportion to an increase in the number of the bits that are to be converted.

A second problem is that the number of elements to be used increases with an increase in the number of the bits that are to be converted; i.e., a conspicuously increased area is occupied by the elements and the consumption of electric power increases greatly.

SUMMARY OF THE INVENTION

The object of the present invention therefore is to provide a thermometric-binary code conversion method and a circuit capable of increasing the rate of conversion, decreasing an area occupied by the elements and decreasing the consumption of electric power without losing error correction function.

The thermometric-binary code conversion circuit according to the present invention realizes a code conversion using a logic circuit that realizes a thermometric-binary code equation expressed by Boolean algebra. Concretely, the thermometric-binary code conversion circuit has a conversion unit for directly converting a thermometric code into a binary code by using a multi-input-three-value-output logic circuit for a logical product portion of the thermometric-binary code conversion equation, without having dependence between a high-order bit and a low-order bit of the binary code that is to be output, eliminating the need for holding the data of high-order bits, without forming an intermediate code and without losing the error-decreasing function.

The thermometric-binary code conversion circuit according to the present invention is capable of determining the values of all output bits through a single time of operation without having dependence between the high-order bit and the low-order bit of the binary code that is to be output, and suppresses an increase in the delay time necessary for the code conversion caused by an increase in the number of the output bits.

Further, the thermometric-binary code conversion circuit according to the present invention suppresses a phase difference among the output bits and, hence, requires neither the output latch circuit for holding the data nor the flip-flop circuit and, further, makes it possible to decrease the area occupied by the elements and to decrease the consumption of electric power.

BRIEF DESCRIPTION OF THE DRAWINGS

FIG. 2 is a diagram illustrating the results of correction of sparkling error according to the prior art shown in FIG. 1;

FIG. 4 illustrates a truth table of a logic circuit included in the embodiment of FIG. 3;

FIG. 17 is a diagram illustrating the results of correction of sparkling error according to the present invention in the case of a three-bit output.

DESCRIPTION OF THE PREFERRED EMBODIMENTS

Figure 1:
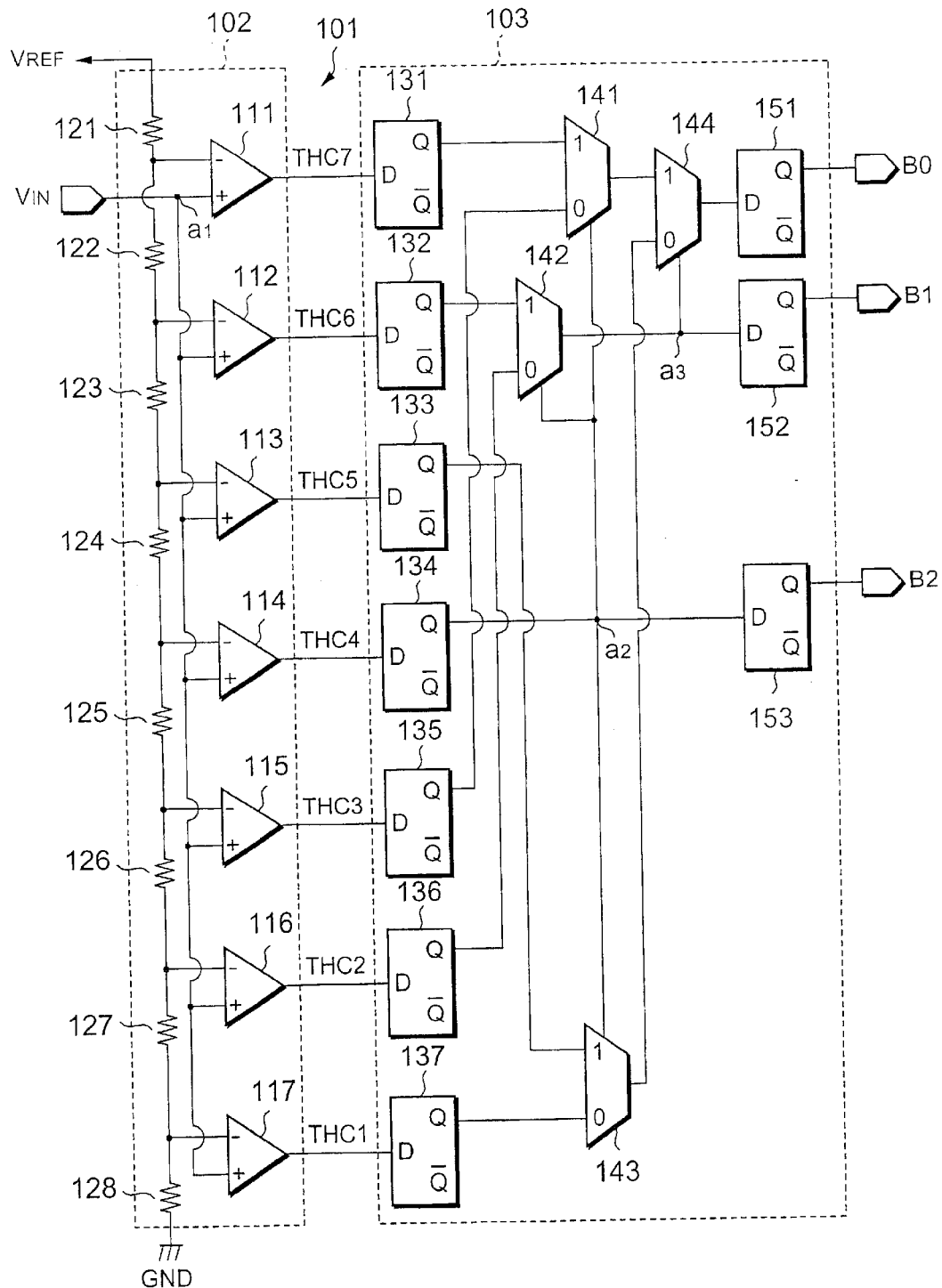
FIG. 1 is a block diagram illustrating the constitution of a flush A/D converter including a conventional thermometric-binary code conversion circuit.

For easy comprehension of the invention, described below with reference to FIG. 1 is a conventional flush A/D converter including a conventional thermometric-binary code conversion circuit disclosed in the prior art 1.

A flush A/D converter 101 includes a comparator array 102 and a dichotomizing search encoder 103 which words as a thermometric-binary code conversion circuit. The flush A/D converter 101 is a three-bit flush A/D converter. The comparator array 102 includes first to seventh comparators 111 to 117 and first to eighth resistors 121 to 128, and is supplied with a reference voltage $V_{REF}$. The comparator array 102 receives an analog voltage signal $V_{IN}$, and outputs a thermometric code comprising first to seventh thermometric bits THC1 to THC7. In the thermometric code, the seventh thermometric bit THC7 is the most significant bit (MSB) and the first thermometric bit THC1 is the least significant bit (LSB). Each comparator has a plug input (non-inverted input) terminal, a minus input (inverted input) terminal, and an output terminal.

The plus input terminals of the first to seventh comparators 111 to 117 are connected to a first node a1. The analog voltage signal $V_{IN}$ is fed to the first node a1. The first to eighth resistors 121 to 128 are connected in series between the reference voltage $V_{REF}$ and an earth potential GND. That is, the reference voltage $V_{REF}$ is applied to an end of the first resistor 121. A connection point of the first resistor 121 and the second resistor 122 is connected to the minus input terminal of the first comparator 111. A connection point of the second resistor 122 and the third resistor 123 is connected to the minus input terminal of the second comparator 112. A connection point of the third resistor 123 and the fourth resistor 124 is connected to the minus input terminal of the third comparator 113. A connection point of the fourth resistor 124 and the fifth resistor 125 is connected to the minus input terminal of the fourth comparator 114. A connection point of the fifth resistor 125 and the sixth resistor 126 is connected to the minus input terminal of the fifth comparator 115. A connection point of the sixth resistor 126 and the seventh resistor 127 is connected to the minus input terminal of the sixth comparator 116. A connection point of the seventh resistor 127 and the eighth resistor 128 is connected to the minus input terminal of the seventh comparator 117. The earth potential GND is connected to an end of the eighth resistor 128. The seventh to first thermometric bits THC7 to THC1 are output from the output terminals of the first to seventh comparators 111 to 117.

The dichotomizing search encoder 103 is constituted by first to seventh input D-flip-flops 131 to 137, first to fourth multiplexers 141 to 144, and first to third D-output flip-flops 151 to 153. Each D-flip-flop has an input terminal D, an output terminal Q and an output terminal $\overline{Q}$. Each multiplexer has an input terminal "1", an input terminal "0", a selection input terminal and an output terminal.

The seventh to first thermometric bits THC7 to THC1 of the thermometric code are supplied to the input terminals D of the first to seventh input D-flip-flops 131 to 137. The output terminal Q of the first input D-flip-flop 131 is connected to the input terminal "1" of the first multiplexer 141. The output terminal Q of the second input D-flip-flop 132 is connected to the input terminal "1" of the second multiplexer 142. The output terminal Q of the third input D-flip-flop 133 is connected to the input terminal "1" of the third multiplexer 143. The output terminal Q of the fourth input D-flop-flop 134 is connected to a second node a2. The output terminal Q of the fifth input D-flip-flop 135 is connected to the input terminal "0" of the first multiplexer 141. The output terminal Q of the sixth input D-flip-flop 132 is connected to the input terminal "0" of the second multiplexer 142. The output terminal Q of the seventh input D-flip-flop 137 is connected to the input terminal "0" of the third multiplexer 143.

The selection input terminals of the first to third multiplexers 141 to 143 are connected to the second node a2. The output terminal of the first multiplexer 141 is connected to the input terminal "1" of the fourth multiplexer 144. The output terminal of the second multiplexer 142 is connected to a third node a3. The output terminal of the third multiplexer 143 is connected to the input terminal "0" of the fourth multiplexer 144. The selection input terminal of the fourth multiplexer 144 is connected to the third node a3.

The output terminal of the fourth multiplexer 144 is connected to the input terminal D of the first output D-flip-flop 151. The third node a3 is connected to the input terminal D of the second output D-flip-flop 152. The second node a2 is connected to the input terminal D of the third output D-flip-flop 153. The first to third output D-flip-flops 151 to 153 output the binary code of three bits consisting of zero-th to second bits B0, B1 and B2. In the binary code, the second bit B2 represents the most significant bit (MSB), the zero-th bit b0 represents the least significant bit (LSB), and a first bit B1 represents an intermediate bit.

Described below is the operation of the flush A/D converter 101. Voltage levels of eight stages are formed by the first to eighth resistors 121 to 128 connected in series between the reference voltage $V_{REF}$ and the earth potential GND. The voltage levels of eight stages and the voltage of the analog voltage signal $V_{IN}$ are compared by the first to seventh comparators 111 to 117, and the magnitudes thereof are output by the first to seventh thermometric bits THC1 to THC7 of the comparator array 102 as the thermometric code of eight stages of from "0000000" to "1111111".

The thermometric code is given to the dichotomizing search encoder 103. Here, the dichotomizing search is realized by selecting a central bit THC4 of the thermometric code as the second bit (most significant bit) B2 of the binary code, selecting the first bit (intermediate bit) B1 is the binary code according to a value of the second bit B2 of the binary code, and selecting the zero-th bit (least significant bit) B0 of the binary code depending on the values of the second and first bits B2 and B1 of the binary code, so that the thermometric code is converted into a desired binary code.

The method disclosed in the prior art 1 exhibits the effect particularly in regard to minimizing a maximum sparkling error as shown in FIG. 2. That is, when the thermometric code involving an error in which bubbling is occurring is converted, the output is so corrected that the error is deviated by a single level only relative to the case when an ideal thermometric code is input.

There has also been known a thermometric-binary code conversion circuit which is different from the above-mentioned thermometric-binary code conversion circuit. For example, JP-H-5-218880 (hereinafter referred to as "prior art 2") proposes a method of converting code of thermometric code data, as well as a decoder and a converter used for this method. According to this code conversion method, the thermometric code is not directly converted, and the number of the required comparators (gates) is decreased by using an intermediate code having a decreased number of bits. According to this prior art 2, the intermediate code uses a second matrix and a third matrix picked up from a first matrix. Thus, there exist uniform blocks of "0" or "1" separated by diagonal lines of the matrix, facilitating the processing. Besides, the converter can be easily integrated into a semiconductor circuit.

In other words, according to the prior art 2, the thermometric code is divided into submatrixes so as to be "degraded" into characteristic portions. A binary code is formed by combining a circuit that encodes the degraded portions and a selector that indicates which portions are degraded. Therefore, this portion is forming an "intermediate code". A "conversion unit in which the output value is degraded" that is called "folding type" exists in a portion of before producing the thermometric code, creating an encoder which is in good match with this state.

The operation is briefly described below. The input is once changed over while selecting which "degraded" portion be read out by using the selector. At the same time, a portion that becomes the binary code is handed from the selector over to the next stage. Next, the submatrix is encoded by using an input signal that is changed over. Finally, the whole outputs are produced in timing using flip-flops. Thus, since the submatrixes only are encoded, the scale of the circuit of the encoder unit can be reduced.

Further, JP-H-7-95089 (hereinafter referred to as "prior art 3") proposes "an encoder and an A/D converter" capable of automatically correcting simple judgement error at the time of converting the thermometric or circulating signals. The encoder according to this prior art 3 includes n sets of exclusive OR gates and a coded matrix of n rows and plural pairs of columns. A pair of columns obtain a differential output of a bit of a binary signal. The row/column coupling of the matrix is effected by the transistors. According to the prior art 3, the pair of pseudo-columns of 0 degree are coupled to the row, like the coupling of the pair of the primary columns with the exception of using a circulating shift concerning the digit of the row. A logic signal of the output of the pair of pseudo-columns of 0 degree and a logic signal of the output of the pair of primary columns are input to the input of an additive exclusive OR gate, and a bit of 0 degree is output therefrom.

In other words, according to the prior art 3, an "intermediate code" which, in this field of art, is called one hot code (OHC) is formed by using an exclusive OR gate or the like. The OHC is input to encoder matrixes of two systems. The encoder matrixes of two systems are employed from such a viewpoint that an error that happens to occur can be offset, and a correct logic is obtained even in the absence of error. That is, the matrixes of two systems are so contrived that a correct value is obtained when the outputs thereof are subjected to the exclusive OR operation. Owing to this constitution, error that happens to occur can be corrected by subjecting the encoded results of two systems to the exclusive OR operation.

However, the following problems is involved in the method of converting the data from the thermometric code into the binary code according to the dichotomizing search encoder 103 taught in the above-mentioned prior art 1.

A first problem is that the rate of conversion decreases in proportion to an increase in the number of the bits that are to be converted. The reason is because when the binary code of N bits is to be obtained, the binary output signal of an m-th bit (m: $0 \leq m \leq N/2$) is not allowed to start the next search unless the search has been effected up to a high-order (m+1)-th bit due to the nature of the dichotomizing search conversion method. In other words, the dichotomizing search has a dependence between the high-order bit and the low-order bit in the output. When it is desired to obtain a binary code output of N bits, therefore, the search must be effected N times and the searching time extends in proportion to the number of the bits.

A second problem is that the number of the elements to be used increases with an increase in the number of the bits that are to be converted, i.e., an increased area is occupied by the elements and a very increased amount of electric power is consumed. The reason is because since the dichotomizing search is effected from the high-order bit toward the low-order bit, a phase difference occurs in the output data between the most significant bit (MSB) and the least significant bit (LSB), and N bits of latch circuits or flip-flop circuits must be provided in the output unit to cancel the phase difference by bringing the phases in match. To search the m-th bit, further, the searched results must be held up to the high-order (m+1)-th bit, requiring latch circuits or flip-flop circuits in a number of ($2^N-1$) in the input portion of the thermometric code. In order to effect the dichotomizing search, further, switching circuits must be provided in a number of ($2^N-1$).

Therefore, each D-flip-flop can be constituted by a elements. Even when a selector is constituted by 4 elements, the conversion into the binary code of N bits still needs elements of a number of $(N+(2^N-1)\times 8+(2^{N-1})\times 4=(10\times 2^N+8N-8)$. When, for example, N=3, there are required elements of a number of 96.

The above-mentioned prior arts 2 and 3 simply disclose technical ideas for converting the code by forming the intermediate code. These prior arts are quite different in technical idea from the present invention which directly converts the code without forming the intermediate code as will become obvious from the following description.

A thermometric-binary code conversion circuit according to a first embodiment of the present invention will now be described with reference to FIG. 3. In the following description, symbols representing the terminal names also represent wiring names and signal names and, in the case of a power source, further expresses its voltage value unless stated otherwise.

Figure 3:
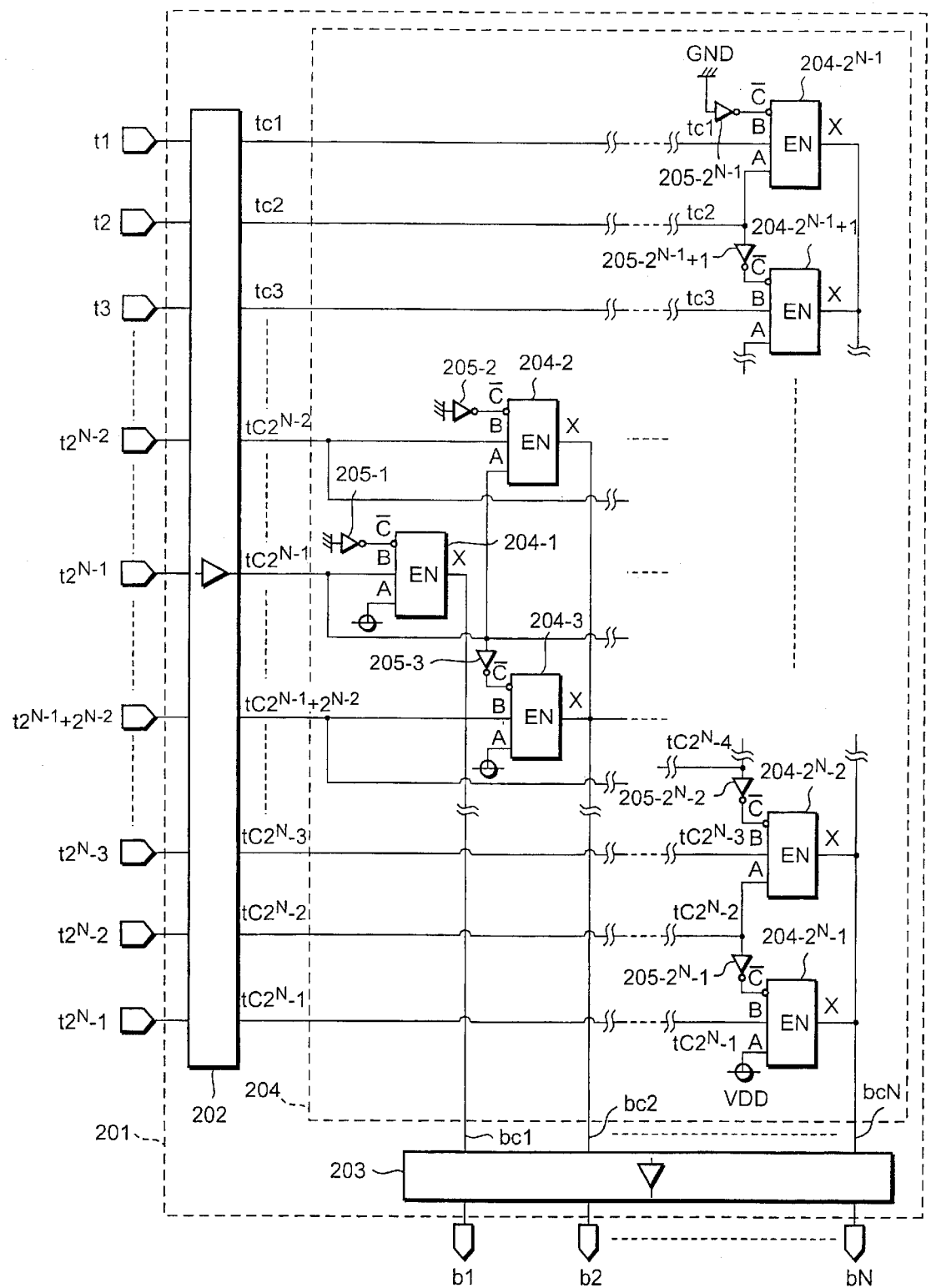
FIG. 3 is a block diagram illustrating the constitution of a thermometric-binary code conversion circuit according to a first embodiment of the present invention.

In FIG. 3, a thermometric-binary code conversion circuit 201 converts a thermometric input signal of $2^N-1$ bits into a binary code of N bits to output it. The thermometric-binary code conversion circuit 201 is constituted by an encoder unit 204 wired and constituted according to a thermometric-binary code conversion equation 1 that will be described later, as a core, and by an input unit 202 for receiving the thermometric input signals and an output unit 203 for producing binary output signals.

The input unit 202 is a circuit which converts the thermometric input signals t1 to $t2^N-1$ of ($2^N-1$) bits as encode input signals tc1 to $tc2^N-1$ of ($2^N-1$) bits into logic values (inclusive of complementary signals) and potentials suited for the encoder unit 204. Here, in FIG. 3, t1 represents the most significant bit, $t2^N-1$ represents the least significant bit, tc1 represents the most significant bit, and tc2−1 represents the least significant bit. Depending on the cases, further, the input unit 202 may include a circuit for adjusting the input timing. Concretely, the input unit 202 is realized by the combination of a buffer/inverter circuit, a level conversion circuit, a latch/flip-flop circuit, and an output level-clamping circuit.

The output unit 203 is a circuit which converts encoded output signals bc1 to bcN of N bits of the encoder unit 204 as binary output signals b1 to bN of N bits into logic values (inclusive of complementary signals) and potentials that can be expected as outputs, and produces them to an external unit. Here, in FIG. 3, bc1 represents the most significant bit, bcN represents the least significant bit, b1 represents the most significant bit and bN represents the least significant bit. Depending on the cases, further, the output unit 203 may include a circuit for adjusting the output timing. The output unit 203, too, is realized by the combination of a buffer/inverter circuit, a level conversion circuit, a latch/flip-flop circuit, and an output level-clamping circuit, like the input unit 202.

The encoder unit 204 is so connected as to receive the encode input signals tc1 to tc2$^N$-1 of the number of (2$^N$-1) from the input unit 202 and to give encoded output signals bc1 to bcN of the number of N to the output unit 203. The encoder unit 204 includes first to (2$^N$-1)-th multi-input-three-value-output encoder element circuits 204-1 to 204-2$^N$-1 in compliance with a truth table shown in FIG. 4 in order to realize the elements (=logical product portions) $\bar{t}_x \times t_y \times t_z$ of the logical sum in a thermometric-binary conversion equation (hereinafter referred to as conversion equation) expressed by the following equation (1). The encoder unit 204 further includes first to (2$^N$-1)-th inverter circuits 205-1 to 205-2$^N$-1 in order to form a complementary signal $\bar{t}_x$ of a thermometric code $t_x$.

$$b_m = \sum_{p=1}^{2^{(m-1)}} (\bar{t}_x \times t_y \times t_z) \tag{1}$$

where $b_m$ represents a value of the binary code of m-th bit (m: 1≦m≦N) as counted from the most significant bit, $t_x$, $t_y$ and $t_z$ represent values of the thermometric codes of x-th bit, y-th bit and z-th bit (x: 0≦x≦2$^N$-2, y: 1≦y≦2$^N$-1, z: 2≦z≦2$^N$) as counted from the most significant bit, $\bar{t}_x$ represents a complement of the thermometric code $t_x$ of the x-th bit. In addition, it is supposed that $\bar{t0}$ is equal to 1 and that τ2$^N$ is equal to 1.

Further, x, y and z are expressed by the following equations (2), (3) and (4), $$x = 2(p-1) \times 2^{(N-m)} \tag{2}$$

$$y = [2(p-1)+1] \times 2^{(N-m)} \tag{3}$$

$$z = 2p \times 2^{(N-m)} \tag{4}$$

Here, the first to (2$^N$-1)-th inverter circuits 205-1 to 205-2$^N$-1 may be omitted provided the corresponding complementary signal $\bar{t}_x$ is formed by the input unit 202. Further, the input unit 202 may be omitted provided the thermometric input signals t1 to t2$^N$-1 of the number of (2$^N$-1) are in match in the encoding unit 204 concerning the desired logic, potential and timing. Similarly, it needs not be pointed out that the output unit 203 may be omitted provided the output of the encoding unit 204 is satisfying the standards concerning the logic of the binary code output signal, potential, output impedance and timing required for the thermometric-binary code conversion circuit 201. The constitution and operation thereof can be easily implied by people skilled in the art from the constitution and operation of this embodiment. These constitution and operation, however, have no direct relationship to the present invention and are not described here in detail.

Described below is the operation of this embodiment. First, the above-mentioned conversion equation 1 can be employed for expressing the code conversion of the thermometric code into the binary code using Boolean algebra. The conversion equation 1 has no dependence between the high-order bit and the low-order bit unlike that of the dichotomizing search, does not have to hold the data of the high-order bit, and is capable of directly effecting the conversion for each of the output bits.

Here, the logic product portion $\bar{t}_x \times t_y \times t_z$ of the conversion equation 1 simply deforms the logic product portion $\bar{t}_x \times t_y$ of the conversion equation 2 expressed by the following equation (5), $$b_m = \sum_{p=1}^{2^{(m-1)}} (\bar{t}_x \times t_y) \tag{5}$$

by using a theorem A×1=A of Boolean algebra yet maintaining the feature of the thermometric code. The conversion equation can be easily derived from a table of correspondence of thermometric-binary codes. Quite a great number of conversion equations other than the conversion equations 1 and 2 can be easily derived by using various theorems of Boolean algebra. Derivation and proof of the conversion equations 1 and 2 have no direct relationship to the present invention, and are not described here.

The input unit 202 so works as to offer encode input signals tc1 to tc2$^N$-1 adapted to the encoder unit 204 from the thermometric input signals t1 to t2$^N$-1 that are input in a number of (2$^N$-1). As described earlier, the input unit 202 can be realized by using a buffer/inverter circuit, a level conversion circuit, a latch/flip-flop circuit or an output level-clamping circuit alone or in combination, or without using such circuit but simply permitting the input signals to pass through.

The encoder unit 204 transmits the encode input signals tc1 to tc2$^N$-1 of the number of (2$^N$-1) as the encoded output signals bc1 to bcN of the number of N through encoder element circuits that will be described later, to the output unit 203 of the next stage.

As described above, the encoder element circuit is a logic circuit for operating the Boolean algebra equivalent to the elements (=logic product portions) $\bar{t}_x \times t_y \times t_z$ of the logic sum of the equation 1. The input terminals A, B, C ($\overline{C}$) of the encoder element circuit correspond to the logic product portions $t_z$, $t_y$ and $t_x$ ($\bar{t}_x$).

Figure 5A:
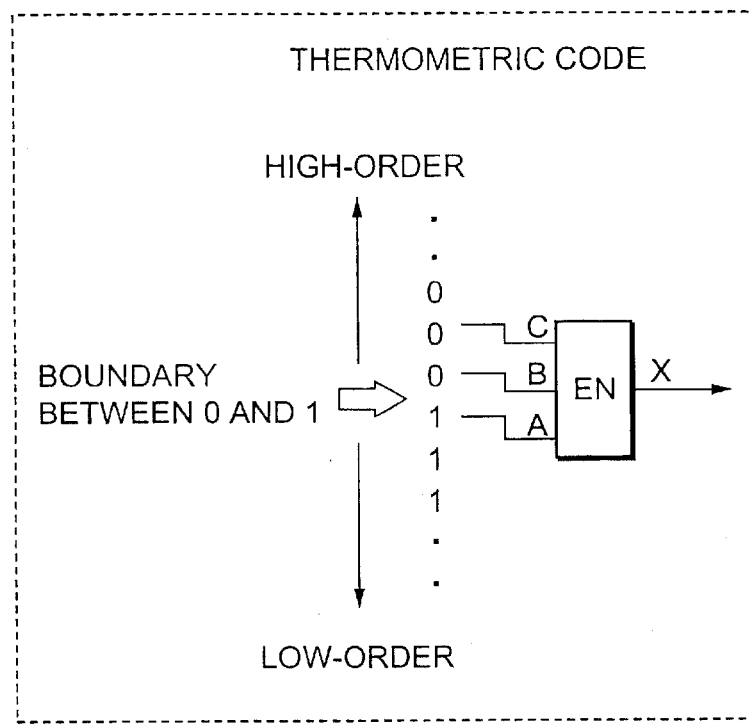
FIGS. 5A and 5B are block diagrams illustrating a first operation state of an encoder element circuit shown in FIG. 3.
Figure 5B:
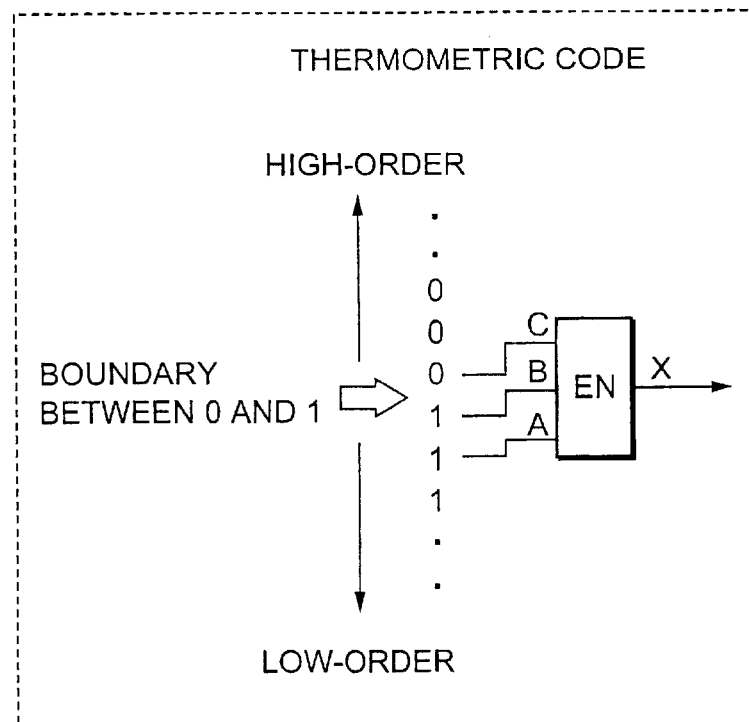

The encoder element circuit includes the following three states by taking the input of thermometric code into consideration. A first state is the one in which the boundary between "0" and "1" of the thermometric code is input to the combination of inputs A and B or B and C ($\overline{C}$) of the encoder element circuit that is drawing attention. This is the state (S1) of FIG. 4, which can be expressed by FIG. 5A or 5B. The first step is important in determining that the thermometric code that was input is converted into a bit "0" or "1" that is drawing attention in the binary code. This stands for a state in which as "X=B" while "A=1 and C=0 ($\overline{C}$=1)", the value of B is output as a value of a bit that is drawing attention in the binary code. The encoder element circuit that is drawing attention at this moment can be replaced by the words "state in which the output is activated".

A second state is the one in which the inputs A, B and C of the encoder element circuit drawing attention are all "0" or "1". This is the state (S2) of FIG. 4, which can be expressed by FIG. 6A or 6B. The state of the encoder element circuit at this moment corresponds to the left side "0" of 0+1=1 from the standpoint of Boolean algebra. In practice, however, when a logic circuit that outputs "0" and a logic circuit that outputs "1" in a state where the output is activated, are connected to the same wiring (in this case, the same bit that is drawing attention as a binary code), a correct logic is not often output since there exists a current path from VDD to GND (see FIG. 3).

In order to prevent such a conflict of output data, therefore, it becomes necessary to realize a state (high-impedance state) in which the encoder element circuit is cut off, as the second state. The encoder element circuit that is drawing attention at this moment can be said to be "a state in which the output is inactivated".

Finally, a third state is the one in which no thermometric code exists. This is a state (S3) of FIG. 4, which can be expressed by FIG. 7. There is no need of particularly specifying the logical output of the encoder element circuit at this moment. This is because when the code system is such that the thermometric code is successively filled with "1" from the low-order bit, there exists no code of which the low-order bit outputs "0" despite a bit drawing attention is "1". Therefore, there is no need of assigning a code corresponding to the output.

In the third state, therefore, the encoder element circuit which is a portion constituting the embodiment of the present invention may output any logic for an input presuming this state, unless a mismatched thermometric code is input.

Upon possessing the above-mentioned three states, the encoder element circuit operates as a logic circuit performing the operation equivalent to the logic of the logic product portion $\bar{t}_x \times t_y \times t_z$. As will be understood from an embodiment described later, the encode element portion can be realized by using a very small number of elements.

Next, the logic operation equivalent to the conversion equation 1 can be realized on a hardware which is the encoder unit 204 by so connecting the input and output of the encoder element circuit to the thermometric signal line and the binary signal line as to comply with the conversion equation 1.

Finally, the output unit 203 outputs the encoded output signals bc1 to bcN of the number of N as the binary output signals b1 to bN of the number of N that are input of the thermometric-binary code conversion circuit 201. This is realized by using a buffer/inverter circuit, a level conversion circuit, a latch/flip-flop circuit or an output level-clamping circuit alone or by using a combination thereof as the output unit 203, or by using none of these circuits but simply permitting the signals to pass through. Thus, a series of code conversion operations of the thermometric-binary code conversion circuit 201 are completed.

Next, described below is the effect of the thermometric-binary code conversion circuit according to a first embodiment of the present invention. In the first embodiment, the output bits can be all determined through a single time of operation without dependence between the high-order bit and the low-order bit of the binary code that is output by using the conversion equation 1 expressed by Boolean algebra without relying on the dichotomizing search. This suppresses an increase in the delay time needed for the code conversion despite of an increase in the number of the output bits. Besides, since there is no dependence between the high-order bit and the low-order bit of the binary code that is output, no function is required for holding the content of the high-order bit for defining the low-order bit, making it possible to decrease the area occupied by the elements and the consumption of electric power correspondingly.

Figures 7, 8:
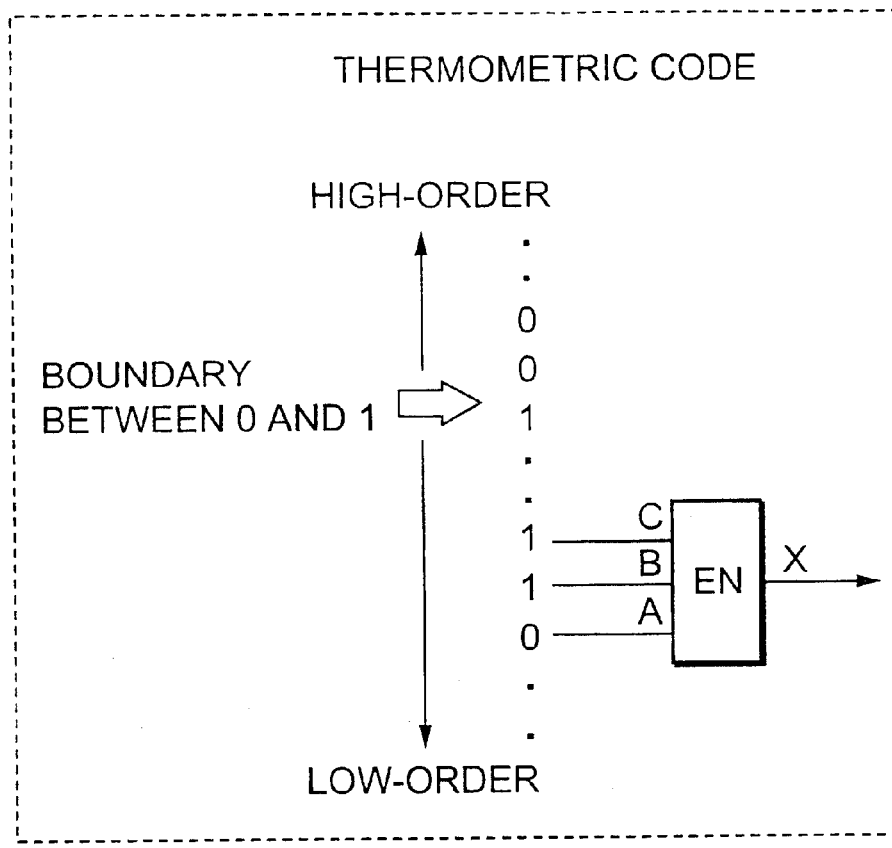
FIG. 7 is a block diagram illustrating a third operation state of the encoder element circuit shown in FIG. 3.
FIG. 8 is a diagram illustrating the results of correction of sparkling error according to the present invention shown in FIG. 3.

FIG. 8 illustrates the effect for decreasing a maximum sparkling error in case that a three-bit binary code is output according to the present invention in comparison with a decrease in the error according to the prior art 1. As will be obvious from FIG. 8, the effect for decreasing error can be maintained even by using the conversion equation 1.

Figure 9:
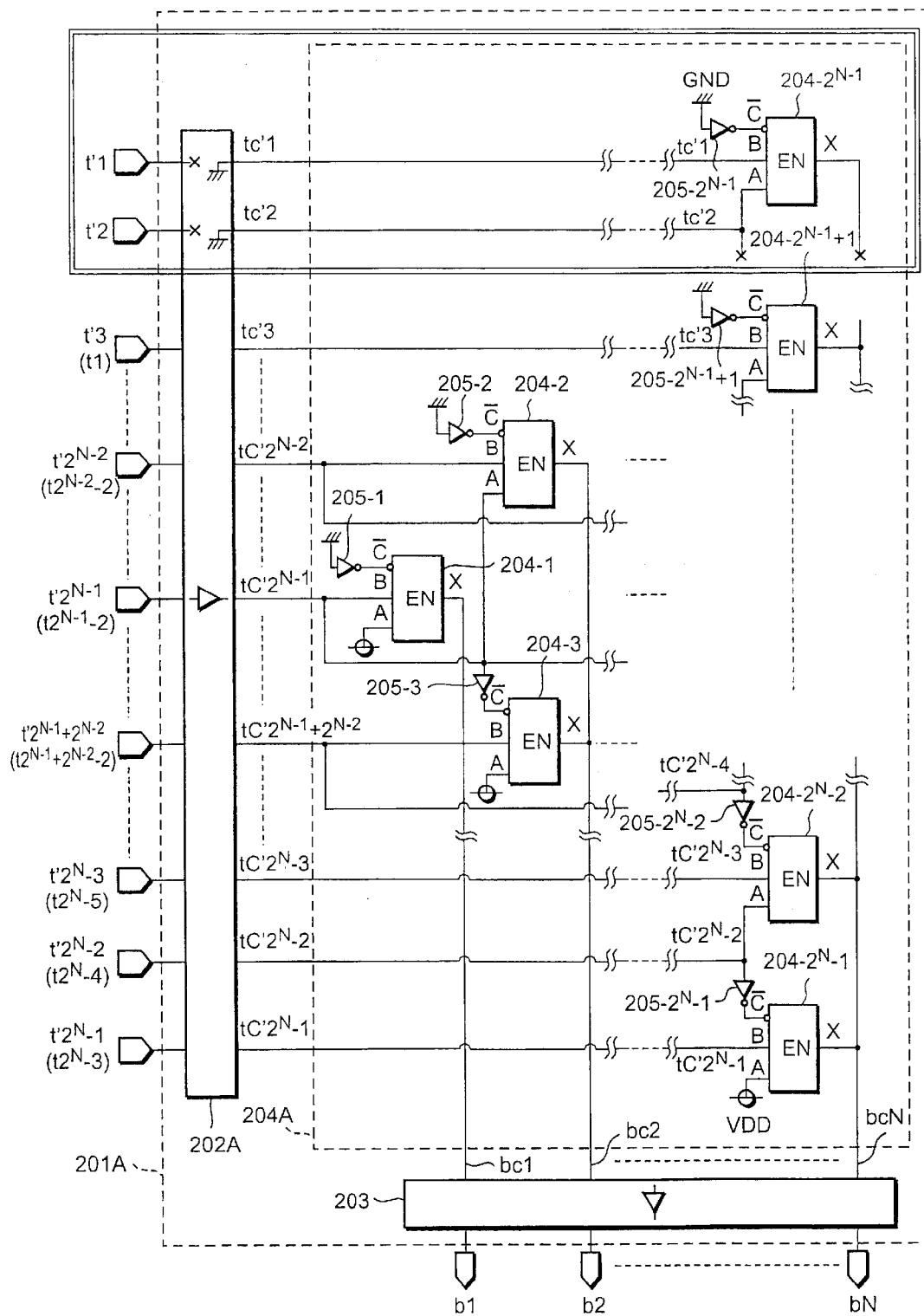
FIG. 9 is a block diagram illustrating the constitution of the thermometric-binary code conversion circuit according to a second embodiment of the present invention.

Next, described below with reference to FIG. 9 is a thermometric-binary code conversion circuit according to a second embodiment of the present invention. The second embodiment shown in FIG. 9 has the same basic constitution as that of the first embodiment, but features an improvement in the encoder unit 204. This embodiment deals with a circuit for converting thermometric input signals of from $(2^N-2)$ bits to $2^{N-1}$ bits into binary output signals of N bits. There are three different points from the first embodiment.

First, the signal lines of a number corresponding to a difference between the number of the thermometric codes that are input and the number $(2^N-1)$ are temporarily provided as bit signals of orders higher than the most significant bit of the thermometric signal line that is really existing. For the purpose of convenience, the thermometric input signals t1 to tp of p bits that are input are assigned again as t'1 to t'$2^N$-1 so as to be corresponded to the conversion equation 1 in the encoder unit 204A. Here, p is an integer expressed as $$2^{N-1} \leq p \leq 2^N-2, \text{ and } tp=t'2^N-1, tp-1=t'2^N-2, tp-2=t'2^N-3, \text{- - -}.$$

Second, it is presumed that the thermometric signal that is virtually provided is always "0", and a low-level signal is supplied to the encoder unit 204A from an output level-clamping circuit (which, in practice, is connected to a power-source line of the low level through a wiring only) in the input unit 202A. Here, the bits are all "0" when the thermometric code represents its minimum value. When the thermometric code represents a maximum value, the code system is so presumed that the bits are all "1".

Figure 6A:
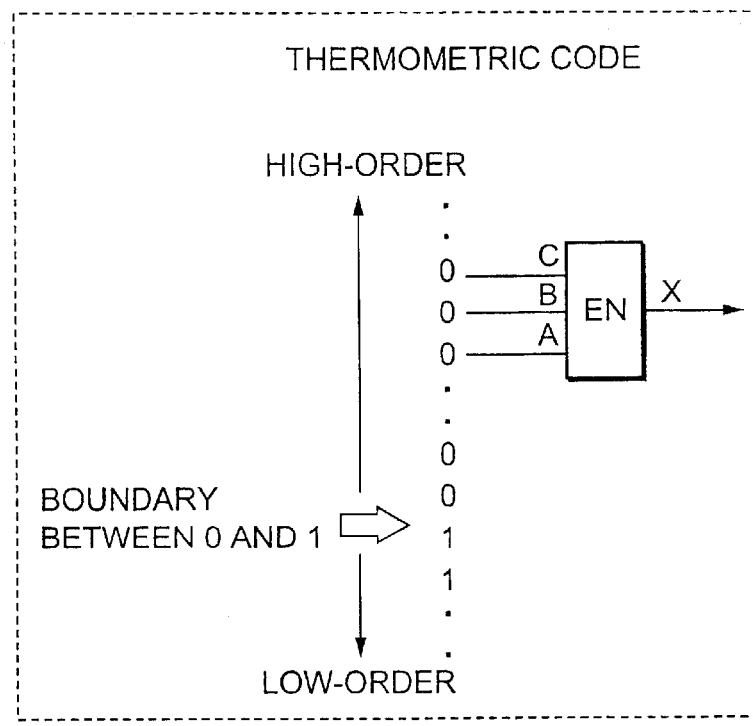
FIGS. 6A and 6B are block diagrams illustrating a second operation state of the encoder element circuit shown in FIG. 3.
Figure 6B:
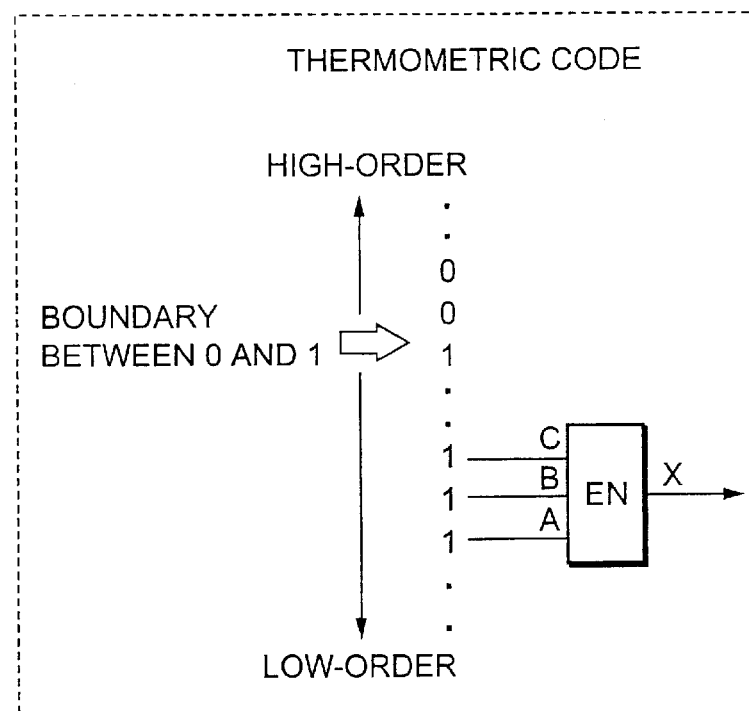

Third, the encoder element circuit that receives the virtually provided thermometric signal lines only has its state corresponding to the state (S2) of FIG. 4 or FIG. 6A. Therefore, the encoder element circuit produces an output of a high-impedance state which is equivalent to the one in which no output is existing from the first time. Therefore, the corresponding encoder element circuits are all deleted.

By taking the first and second differences into consideration, as described above, it is allowed to realize a circuit quite equivalent to the constitution and operation of the first embodiment by really adding nothing to the circuit. By taking the third difference into consideration, further, the binary code to be converted is not affected at all even by omitting the encoder element circuit that receives a fixed value (=low level) and produces an output of a high-impedance state. Upon omitting the circuit that is not required for the code conversion, a decreased area is occupied by the elements and the electric power is consumed in decreased amounts.

Upon taking the third difference into consideration, in particular, the output terminals X of many encoder element circuits are connected to a signal line that converts the least significant bit bN of the binary code. Therefore, omitting the unnecessary encoder element circuit results in a decrease in the undesired capacitance of the signal lines and, hence, contributes to increasing the rate of conversion.

FIG. 9 illustrates an embodiment for converting thermometric codes of a number of ($2^N$−3). A portion surrounded by double lines in FIG. 9 is those of the encoder element circuits that are omitted since the virtually provided signal lines (t'1, t'2) are not necessary owing to the above-mentioned three differences.

As described above, the second embodiment of the present invention makes it possible to omit encoder element circuits that are not needed for the code conversion, in addition to obtaining the effect of the first embodiment and, further, makes it possible to decrease the area occupied by the elements, to decrease the consumption of electric power and to increase the rate of code conversion.

Figure 10:
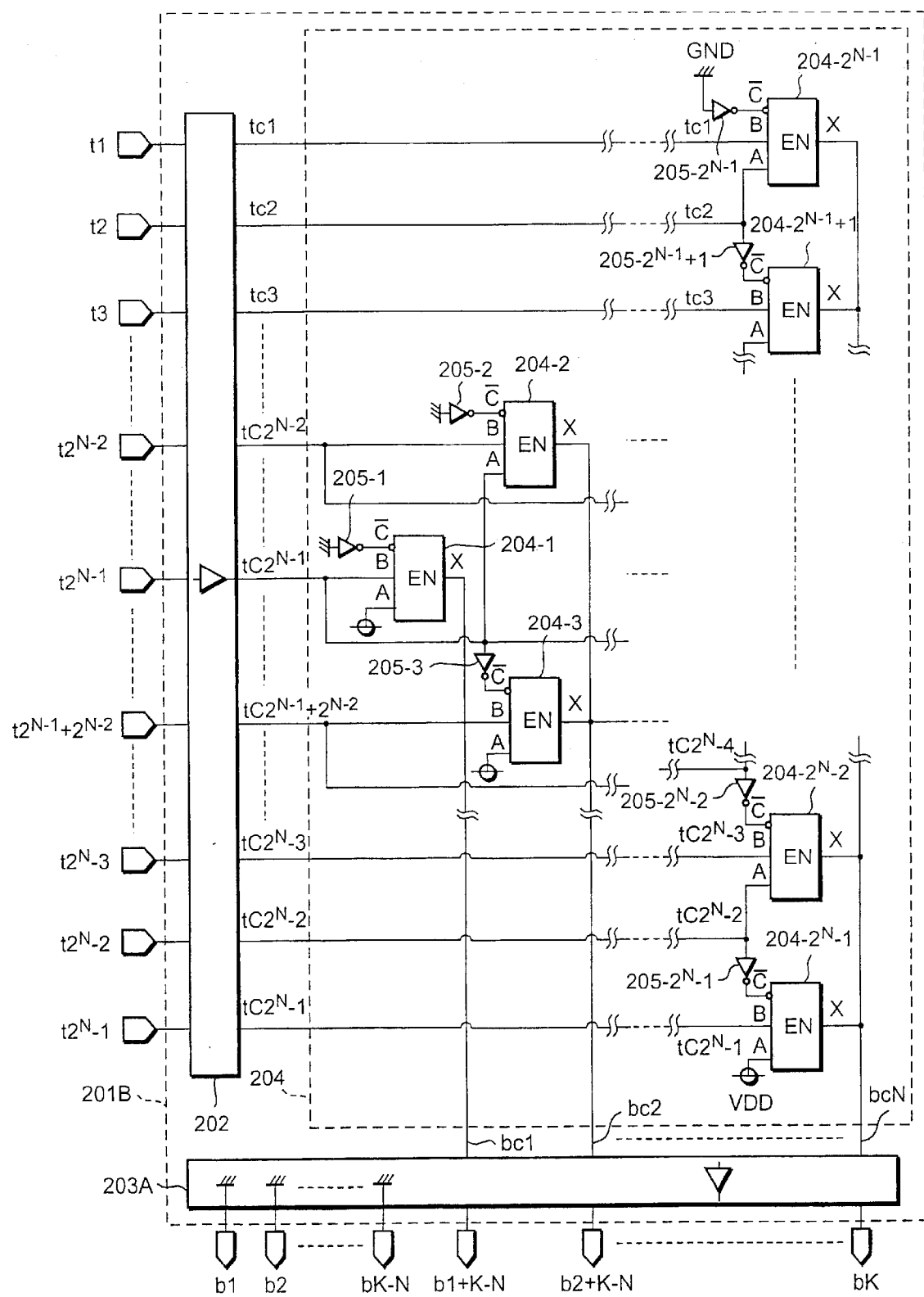
FIG. 10 is a block diagram illustrating the constitution of the thermometric-binary code conversion circuit according to a third embodiment of the present invention.

Next, described below with reference to FIG. 10 is a thermometric binary code conversion circuit according to a third embodiment of the present invention. The third embodiment is the same as the first embodiment concerning its basic constitution, but features an improvement in the output unit 203A and the binary code that is to be output. This embodiment is suited for a conversion circuit that receives, as input signals, thermometric input signals of a number that lies within a range of an integer which is not smaller than unity but is not larger than ($2^N$−1) and produces binary output signals of a number that is not smaller than K=(N+1).

In FIG. 10, the embodiment is different in constitution from the first embodiment concerning the following two points. A first point is that the binary signals (b1 to bK−N) of a high-order (K−N) bit that cannot be converted from the thermometric input signal are producing a low-level signal through the output level-clamping circuit (in this case, simply short-circuited to GND). A second point is that the correspondence between the output signals bc1 to bcN of the encoder unit 204 and the output signals b1 to bK of the thermometric-binary code conversion circuit 201B, is bci= bi+K−N (where i is a positive integer of from 1 to N).

The operation of this embodiment is the same as the operation of the first embodiment except that fixed values are output from the most significant bit to a high-order (K−N)-th bit of the binary signal that is output.

As described above, the third embodiment offers the effect in that the circuit in a state in compliance with the conversion equation 1 needs not be converted from the thermometric input signals up to the encoding unit, and the bit width only of the output binary code can be expanded without adding circuit for the whole conversion circuit, in addition to offering the effect of the first embodiment.

It needs not be pointed out that the second embodiment and the third embodiment may be used in combination.

Figures 11, 12:
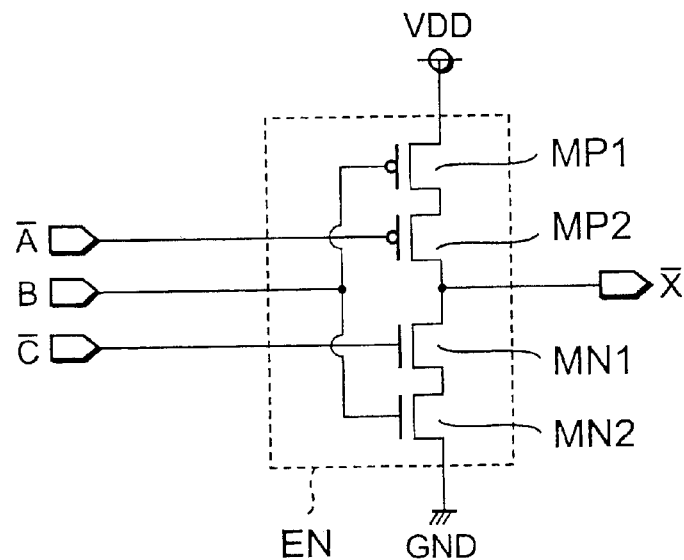
FIG. 11 is a concrete circuit diagram in case that of when the complementary logic is used for the encoder element circuit used in the present invention.
FIG. 12 is a truth table of the circuit shown in FIG. 11.

FIGS. 11 and 12 illustrate an example of an encoder element circuit EN according to the present invention constituted by a complementary logic circuit, wherein FIG. 11 illustrates the constitution of the encoder element circuit EN and FIG. 12 is a truth table therefor.

In FIG. 11, the encoder element circuit EN is constituted by first and second P-channel transistors MP1 and MP2 connected in series between the potential VDD and an inverted output terminal $\overline{X}$ the encoder element circuit EN, and first and second N-channel transistors MN1 and MN2 connected in series between the inverted output terminal $\overline{X}$ and the potential GND.

The gate electrodes of the first P-channel transistor MP1 connected at a position close to the power source of potential VDD and of the second N-channel transistor MN2, are connected in common to a second input terminal B of the encoder element circuit EN. The gate electrodes of the second P-channel transistor MP2 connected at a position close to the inverted output terminal $\overline{X}$ and of the first N-channel transistor MN1, are connected to a first inverted input terminal $\overline{A}$ of the encoder element circuit EN and to a third inverted input terminal $\overline{C}$ thereof, respectively.

Next, described below is the operation of the encoder element circuit EN. It is now presumed that a low-level signal is input to the second input terminal B. In this case, the first P-channel transistor MP1 is turned on and the second N-channel transistor MN2 is turned off. In this case, the second N-channel transistor MN2 remains turned off and, hence, it will be understood that the inverted output terminal $\overline{X}$ is not affected by the value of the third inverted input terminal $\overline{C}$ (state of the first N-channel transistor MN1). In this state, when the first inverted input terminal $\overline{A}$ remains on the low level, then, the second P-channel transistor MP2 is turned on and the inverted output terminal $\overline{X}$ assumes the high level. First, when the first inverted input terminal $\overline{A}$ assumes the high level, the second P-channel transistor MP2 is turned off and the inverted output terminal $\overline{X}$ assumes a high-impedance state.

Similarly, it is presumed that a high-level signal is input to the second input terminal B. In this case, the first P-channel transistor MP1 is turned off and the second N-channel transistor MN2 is turned on. Since the first P-channel transistor MP1 is turned off, the inverted output terminal $\overline{X}$ is not affected by the value of the first inverted input terminal $\overline{A}$ (state of the second P-channel transistor MP2). In this state, when the third inverted input terminal $\overline{C}$ assumes the high level, the first N-channel transistor MN1 is turned on and the inverted output terminal $\overline{X}$ assumes the low level. Further, when the third inverted input terminal $\overline{C}$ assumes the low level, the first N-channel transistor MN1 is turned off and the inverted output terminal $\overline{X}$ assumes the high-impedance state.

It will thus be understood that the encoder element circuit EN shown in FIG. 11 acquires logic states shown in a truth table of FIG. 12.

The contents of the truth table of FIG. 12 are in the form of negative logic outputs relative to the truth table of FIG. 4. The "state" of truth table of FIG. 12 means which one of the "encoder states" is represented in the truth table of FIG. 4.

Figure 13:
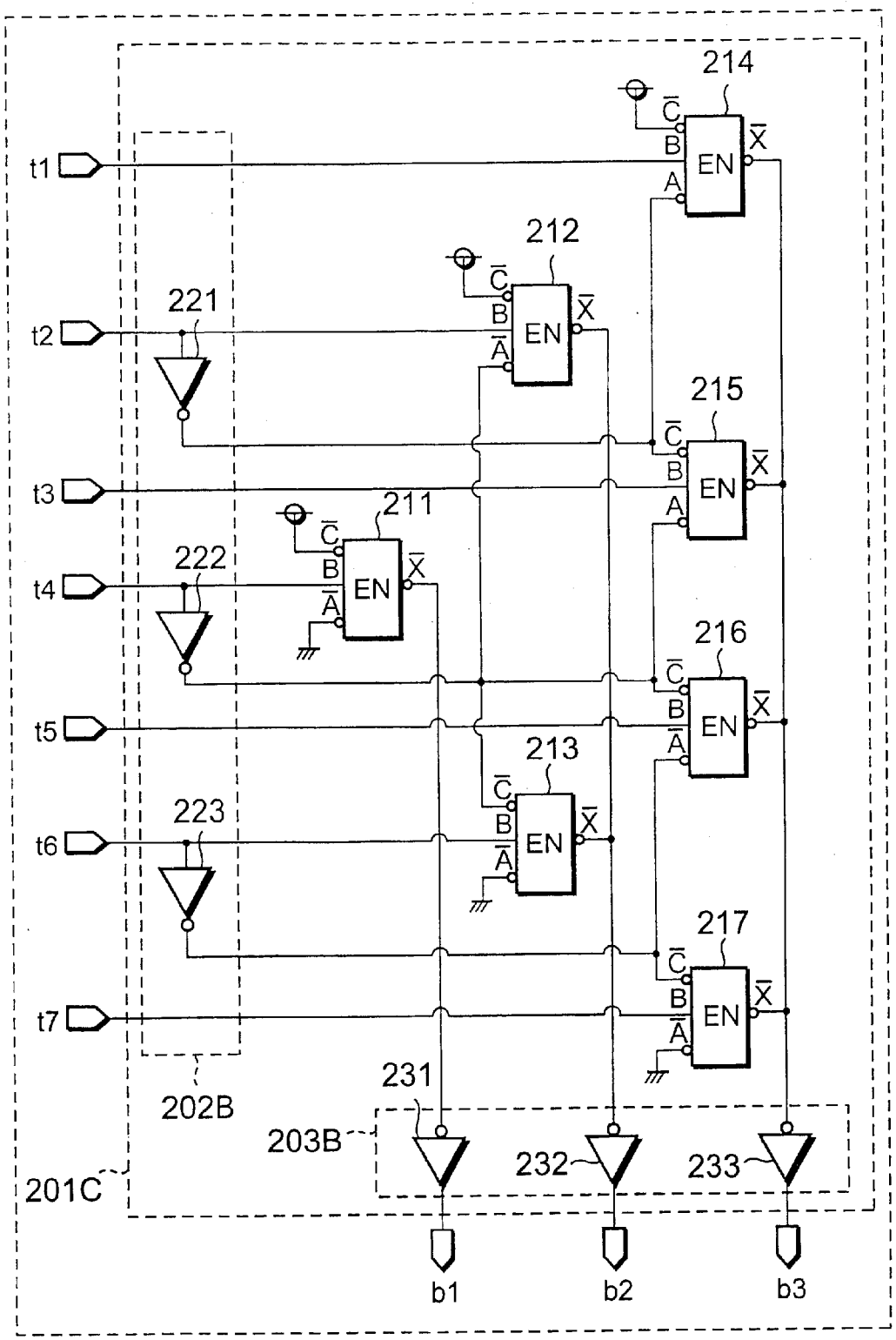
FIG. 13 is a block diagram in case that of when the complementary logic is employed as a concrete example of the present invention.

FIG. 13 illustrates an encoder circuit 201C for producing three-bit binary codes, which is a concrete example of the present invention. To satisfy this example, the logic may be inverted by using an output circuit for the binary code output unit 203B of the encoder circuit 201C. In this case, the binary code output unit 203B is constituted by inverters 231, 232 and 233.

If described in detail, the encoder circuit 201C receives a thermometric input signal of 7 bits and produces a binary output signal of 3 bits. The thermometric input signal of 7 bits consists of first to seventh bits t1, t2, t3, t4, t5, t6 and t7, the first bit t1 being the most significant bit and the seventh bit t7 being the least significant bit. The fourth bit t4 in the 7-bit thermometric input signal is called a central bit or an intermediate bit. The binary output signal of 3 bits consists of first to third bits b1, b2 and b3, the first bit b1 being the most significant bit and the third bit b3 being the least significant bit.

The encoder circuit 201C includes an input unit 202B consisting of first to third input inverters 221, 222 and 223, an output unit 203B consisting of first to third output inverters 231, 232 and 233, and an encoder unit consisting of first to seventh encoder element circuits 211, 212, 213, 214, 215, 216 and 217.

In the input unit 202B, the first input inverter 221 inverts the second bit t2 of the thermometric input signal and outputs a second inverted bit $\overline{t2}$. The second input inverter 222 inverts the fourth bit t4 of the thermometric input signal and outputs a fourth inverted bit $\overline{t4}$. The third input inverter 223 inverts the sixth bit t6 of the thermometric input signal and outputs a sixth inverted bit $\overline{t6}$.

In the encoder unit, the first encoder element circuit 211 is supplied with the potential GND through its first inverted input terminal $\overline{A}$, is served with the fourth bit (central bit) t4 of the thermometric input signal through its second input terminal B, and is supplied with the potential VDD through its third inverted input terminal $\overline{C}$.

The second encoder element circuit 212 is served with the fourth inverted bit $\overline{t4}$ of the thermometric input signal through its first inverted input terminal $\overline{A}$, is served with the second bit t2 of the thermometric input signal through the its second input terminal B, and is supplied with the potential VDD through its third inverted input terminal $\overline{C}$. The third encoder element circuit 213 is supplied with the potential GND through its first inverted input terminal $\overline{A}$, is served with the sixth bit t6 of the thermometric input signal through the its second input terminal B, and is served with the fourth inverted bit $\overline{t4}$ of the thermometric input signal through its third inverted input terminal $\overline{C}$. The inverted output terminal $\overline{X}$ of the second encoder element circuit 212 and the inverted output terminal $\overline{X}$ of the third encoder element circuit 213 are connected together.

The fourth encoder element circuit 214 is served with the second inverted bit $\overline{t2}$ of the thermometric input signal through its first inverted input terminal $\overline{A}$, is served with the first bit (most significant bit) t1 of the thermometric input signal through its second input terminal B, and is supplied with the potential VDD through its third inverted input terminal $\overline{C}$. The fifth encoder element circuit 215 is served with the fourth inverted bit $\overline{t4}$ of the thermometric input signal through its first inverted input terminal $\overline{A}$, is served with the third bit t3 of the thermometric input signal through its second input terminal B, and is served with the second inverted bit $\overline{t2}$ of the thermometric input signal through its third inverted input terminal $\overline{C}$. The sixth encoder element circuit 216 is served with the sixth inverted bit $\overline{t6}$ of the thermometric input signal through its first inverted input terminal $\overline{A}$, is served with the fifth bit t5 of the thermometric input signal through its second input terminal B, and is served with the fourth inverted bit $\overline{t4}$ of the thermometric input signal through its third inverted input terminal $\overline{C}$.

The seventh encoder element circuit 217 is supplied with the potential GND through its first inverted input terminal $\overline{A}$, is served with the seventh bit (least significant bit) t7 of the thermometric input signal through its second input terminal B, and is served with the sixth inverted bit $\overline{t6}$ of the thermometric input signal through its third inverted input terminal $\overline{C}$. The inverted output terminals $\overline{X}$ of the fourth to seventh encoder element circuits 214 to 217 are connected to each other.

In the output unit 203B, the first output inverter 231 has its input terminal connected to an inverted output terminal $\overline{X}$ of the first encoder element circuit 211, and produces the first bit (most significant bit) b1 of the binary output signal from the output terminal thereof. The second output inverter 232 has its input terminal connected to the inverted output terminals $\overline{X}$ of the second and third encoder element circuits 212 and 213, and produces a second bit b2 of the binary output signal from the output terminal thereof. The third output inverter 233 has its input terminal connected to the inverted output terminals $\overline{X}$ of the fourth to seventh encoder element circuits 214 to 217, and produces the third bit (least significant bit) b3 of the binary output signal from the output terminal thereof.

Figures 14, 15:
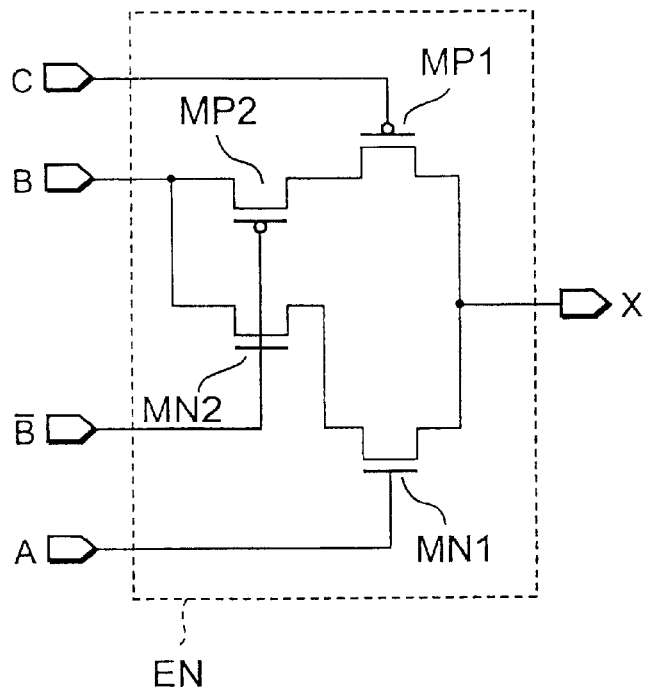
FIG. 14 is a diagram illustrating another concrete circuit in case that of when a pass transistor logic is employed for the encoder element circuit used in the present invention.
FIG. 15 is a truth table of the circuit shown in FIG. 14.

Another example of the encoder element circuit EN of the present invention will be described with reference to FIGS. 14 and 15. This encoder element circuit EN is constituted relying on a pass transistor logic. FIG. 14 illustrates the constitution of the encoder element circuit EN, and FIG. 15 shows a truth table therefor.

In FIG. 14, the encoder element circuit EN includes first and second P-channel transistors MP1 and MP2 connected in series between an output terminal X and a second input terminal B, as well as first and second N-channel transistors MN1 and MN2 connected in series between the output terminal X and a second input terminal B. The series-connected first and second P-channel transistors MP1, MP2 and the first and second N-channel transistors MN1, MN2, are arranged in parallel between the output terminal X and the second input terminal B.

The gate electrode of the first N-channel transistor MN1 connected to the output terminal X is connected to the first input terminal A of the encoder element circuit EN. The gate electrode of the first P-channel transistor MP1 connected to the output terminal X is connected to the third input terminal C of the encoder element circuit EN. The gate electrodes of the second P-channel transistor MP2 and second N-channel transistor MN2 connected to the second input terminal B, are connected in common to the complementary input terminal $\overline{B}$ of the second input terminal B of the encoder element circuit EN. In the following description, the complementary input terminal $\overline{B}$ bar of the second input terminal B is also referred to as the second inverted input terminal.

Next, described below is the operation of the encoder element circuit EN. It is now presumed that a high-level signal is input to the second input terminal B. In this case, the complementary input terminal $\overline{B}$ assumes the low level. The second P-channel transistor MP2 is turned on and the second N-channel transistor MN2 is turned off. In this case, the second N-channel transistor MN2 is turned off, and the output terminal X is not affected by the value of the first input terminal A (state of the first N-channel transistor MN1). In this state, when the third input terminal C is of the low level, then, the first P-channel transistor MP1 is turned on and the output terminal X assumes the high level. Further, when the third input terminal C assumes the high level, the first P-channel transistor MP1 is turned off and the output terminal X acquires the high-impedance state.

Next, it is presumed that a low-level signal is input to the second input terminal B. In this case, the second P-channel transistor MP2 is turned off and the second N-channel transistor MN2 is turned on. Since the second P-channel transistor MP2 is turned off, the output terminal X is not affected by the value of the third input terminal C (state of the first P-channel transistor MP1). In this state, when the first input terminal A is assuming the high level, the first N-channel transistor MN1 is turned on and the output terminal X assumes the low level. When the first input terminal A assumes the low level, further, the first N-channel transistor MN1 is turned off and the output terminal X acquires the high-impedance state.

Thus, the encoder element circuit EN shown in FIG. 14 assumes the logic states shown in the truth table of FIG. 15. The "state" of truth table of FIG. 15 means which one of the "encoder states" is represented in the truth table of FIG. 4.

Figure 16:
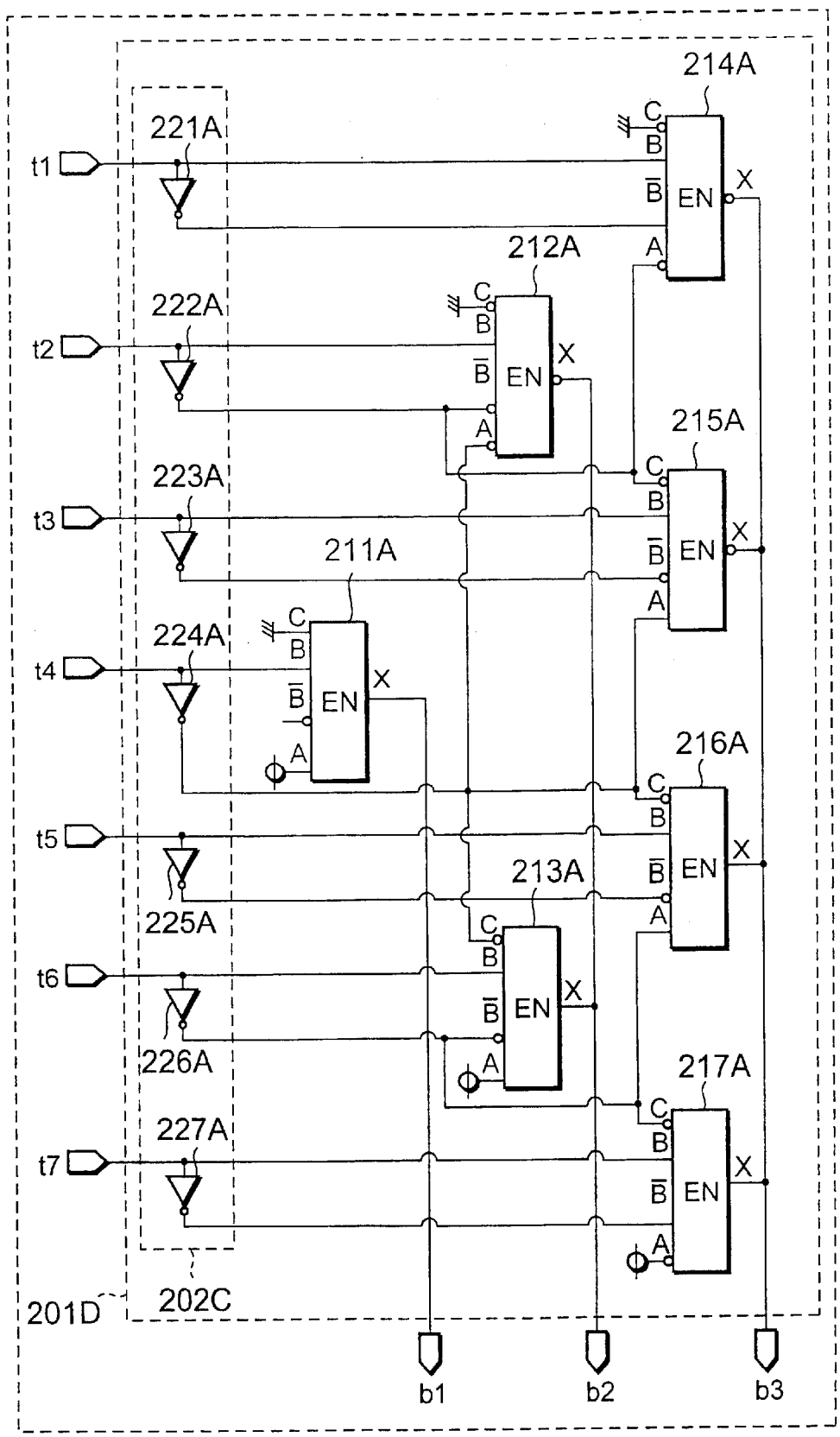
FIG. 16 is a block diagram of when the pass transistor logic is employed as a concrete example of the present invention.

FIG. 16 illustrates a concrete circuit for producing a 3-bit binary code. In this circuit, the encoder element circuits EN illustrated with reference to FIG. 14 are so connected as to satisfy the conversion equation 1 expressed by Boolean algebra according to the first embodiment (FIG. 3) while using complementary signals of the thermometric codes.

FIG. 16 contains many number of complementary signal lines and may appear to involve a complex connection method. The connection, however, has been so made as to satisfy the conversion equation 1 from the standpoint of Boolean algebra, from which it can be easily understood that the operation is equivalent to that of the embodiment shown in FIG. 3.

If described in detail, the encoder circuit 201D shown in FIG. 16 receives a 7-bit thermometric input signal and outputs a 3-bit binary output signal like the encoder circuit 201C shown in FIG. 13. The 7-bit thermometric input signal consists of first to seventh bits t1, t2, t3, t4, t5, t6 and t7, the first bit t1 being the most significant bit and the seventh bit t7 being the least significant bit. Further, the fourth bit t4 of the 7-bit thermometric signal is called a central bit or an intermediate bit. The 3-bit binary output signal consists of first to third bits b1, b2 and b3, the first bit b1 being the most significant bit and the third bit b3 being the least significant bit.

The encoder circuit 201D includes an input unit 202C consisting of first to seventh input inverters 221A, 222A, 223A, 224A, 225A, 226A and 227A, and an encoder unit consisting of first to seventh encoder element circuits 211A, 212A, 213A, 214A, 215A, 216A and 217A.

In the input unit 202C, the first to seventh input inverters 221A to 227A invert the first to seventh bits t1 to t7 of the thermometric input signal, and output the first to seventh inverted bits $\overline{t1}$ to $\overline{t7}$ respectively.

In the encoder unit, the first encoder element circuit 211A is supplied with the potential VDD through its first input terminal A, is served with the fourth bit (central bit) t4 of the thermometric input signal through its second input terminal B, is served with the fourth inverted bit $\overline{t4}$ of the thermometric input signal through its second inverted input terminal $\overline{B}$, and is supplied with the potential GND through its third inverted input terminal $\overline{C}$. The first encoder element circuit 211A outputs the first bit (most significant bit) b1 of the binary output signal from the output terminal X thereof.

The second encoder element circuit 212A is served with the fourth inverted bit $\overline{t4}$ of the thermometric input signal through its first input terminal A, is served with the second bit t2 of the thermometric input signal through its second input terminal B, is served with the second inverted bit $\overline{t2}$ of the thermometric input signal through its second inverted input terminal $\overline{B}$, and is supplied with the potential GND through its third input terminal C. The third encoder element circuit 213A is supplied with the potential VDD through its first inverted input terminal $\overline{A}$, is served with the sixth bit t6 of the thermometric input signal through its second input terminal B, is served with the sixth inverted bit $\overline{t6}$ of the thermometric input signal through its second inverted input terminal $\overline{B}$, and is served with the fourth inverted bit $\overline{t4}$ of the thermometric input signal through its third input terminal C. The output terminal X of the second encoder element circuit 212A and the output terminal X of the third encoder element circuit 213A are connected together to output a second bit b2 of the binary output signal.

The fourth encoder element circuit 214A is served with the second inverted bit $\overline{t2}$ of the thermometric input signal through its first input terminal A, is served with the first bit (most significant bit) t1 of the thermometric input signal through its second input terminal B, is served with the first inverted bit $\overline{t1}$ of the thermometric input signal through its second inverted input terminal $\overline{B}$, and is supplied with the potential GND through its third input terminal C. The fifth encoder element circuit 215A is served with the fourth inverted bit $\overline{t4}$ of the thermometric input signal through its first input terminal A, is served with the third bit t3 of the thermometric input signal through its second input terminal B, is served with the third inverted bit $\overline{t3}$ of the thermometric input signal through its second inverted input terminal $\overline{B}$, and is served with the second inverted bit $\overline{t2}$ of the thermometric input signal through its third input terminal C. The sixth encoder element circuit 216A is served with the sixth inverted bit $\overline{t6}$ of the thermometric input signal through its first input terminal A, is served with the fifth bit t5 of the thermometric input signal through its second input terminal B, is served with the fifth inverted bit $\overline{t5}$ of the thermometric input signal through its second inverted input terminal $\overline{B}$, and is served with the fourth inverted bit $\overline{t4}$ of the thermometric input signal through its third input terminal C. The seventh encoder element circuit 217A is supplied with the potential VDD through its first input terminal A, is served with the seventh bit (least significant bit) t7 of the thermometric input signal through its second input terminal B, is served with th seventh inverted bit $\overline{t7}$ of the thermometric input signal through its second inverted input terminal $\overline{B}$, and is served with the sixth inverted bit $\overline{t6}$ of the thermometric input signal through its third input terminal C. The output terminals X of the fourth to seventh encoder element circuits 214A to 217A are connected to each other to output the third bit (least significant bit) b3 of the binary output signal.

The above-mentioned encoder element circuit EN may assume any logic constitution and any form to constitute the thermometric-binary code conversion circuit illustrated by way of an embodiment of the present invention, provided it has a circuit and logic constitution that satisfy the truth table shown in FIG. 4 in a form by taking the complementary input and output signals into consideration.

FIG. 17 is a diagram illustrating the results of error correction in case that a 3-bit binary code is output.

It will be obvious that the present invention is in no way limited to the above-mentioned embodiments only but can be suitably modified and changed without departing from the technical spirit and scope of the invention.

As will be obvious from the foregoing description, the present invention offers the following effects.

A first effect of the invention is that even when an increased number of bits are output, the rate of conversion does not decrease irrespective of the number of bits. The reason is because the binary code that is to be output determines the data to be output for each of the bits according to the conversion equation 1, and there is no increase in the delay time caused by the dependence between the high-order bit and the low-order bit of the dichotomizing search.

A second effect of the invention is that it is allowed to suppress the area occupied by the elements and the consumption of electric power despite of an increase in the number of the output bits. The reason is because the conversion circuit for producing a binary code of N bits has heretofore been constituted by using elements of the number of $[N+(2^N-1)]\times 8+(2^{N-1})\times 4=(10\times 2^N+8N-8)$ (prior art 1). However, the thermometric-binary code conversion circuit of the present invention shown in FIG. 13 is constituted by elements of the number of $(5\times 2^N+2N-6)$ which is smaller than one-half that of the prior art. In the conversion circuit of the present invention, the number of the elements is calculated based on the following prerequisite. That is, the input unit requires inverters of the number of $(2^{N-1}-1)$ and the output unit requires inverters of the number of N and encoder element circuits of the number of $(2^N-1)$. Each inverter can be constituted by two elements and each encoder element circuit can be constituted by four elements.

A third effect of the present invention is that a maximum sparkling error can be minimized. The reason is as concretely described below. According to the present invention using the elements in decreased numbers, the output error can be corrected to be deviated by a single level only like in the prior art when a thermometric code involving an error in which bubbling is occurring is converted, with respect to the case that an ideal thermometric code is input as shown in FIG. 8.

What is claimed is:

1. A thermometric-binary code conversion method for converting the code of thermometric input signal into a binary output signal, wherein the code is directly converted according to a thermometric-binary code conversion equation expressed by Boolean algebra without forming intermediate code and without having dependence among the bits of the binary output signal, wherein a multi-input-three-value-output logic circuit based on a complementary logic circuit is used as an element for realizing the thermometric-binary code conversion equation.

2. A thermometric-binary code conversion method for converting the code of a thermometric input signal into a binary output signal, wherein the code is directly converted according to a thermometric-binary code conversion equation expressed by Boolean algebra without forming intermediate code and without having dependence among the bits of the binary output signal, wherein a multi-input-three-value-output logic circuit based on a pass transistor logic circuit is used as an element for realizing the thermometric-binary code conversion equation.

3. A thermometric-binary code conversion method according to claim 1, wherein matching is accomplished in an input unit when said thermometric input signal is not in match in regard to time, potential or number of signals.

4. A thermometric-binary code conversion method according to claim 1, wherein matching is accomplished in an output unit when said binary output signal is not in match in regard to time, potential or number of signals for a device or a logic circuit of the next stage provided to receive said binary output signal.

5. A thermometric-binary code conversion circuit for converting the code of a thermometric input signal into a binary output signal, comprising:

an input unit for receiving said thermometric input signal and for outputting an encode input signal;

an encoder unit for receiving said encode input signal and for outputting an encoded output signal; and an output unit for receiving said encoded output signal and for outputting said binary output signal;

wherein said encoder unit directly converts the code according to a thermometric-binary code conversion equation expressed by Boolean algebra, without forming intermediate code and without having dependence among the bits of said binary output signal, wherein said encoder unit comprises a plurality of multi-input-three-value-output logic circuits arranged like a pyramid with a position corresponding to the central bit of said encode input signal as a vertex in order to realize said thermometric-binary code conversion equation.

6. A thermometric-binary code conversion circuit according to claim 5, wherein said multi-input-three-value-output logic circuit is a multi-input-three-value output logic circuit using a complementary logic circuit.

7. A thermometric-binary code conversion circuit according to claim 5, wherein said multi-input-three-value-output logic circuit is a multi-input-three-value output logic circuit using a pass transistor logic circuit.

8. A thermometric-binary code conversion circuit according to claim 5, wherein said input unit is provided for accomplishing the matching when said thermometric input signal is not in match in regard to time, potential or number of signals.

9. A thermometric-binary code conversion circuit according to claim 5, wherein said output is provided for accomplishing the matching when said binary output signal is not in match in regard to time, potential or number of signals for a device or a logic circuit of the next stage provided to receive said binary output signal.

10. A thermometric-binary code conversion circuit for converting the code of a thermometric input signal of $(2^N-1)$ bits into a binary output signal of N (N is an integer of 2 or larger) bits, comprising:

an input unit for receiving said thermometric input signal of $(2^N-1)$ bits and for outputting an encode input signal of $(2^N-1)$ bits;

an encoder unit for receiving said encode input signal of $(2^N-1)$ bits and for outputting an encoded output signal of N bits; and an output unit for receiving said encoded output signal of N bits and for outputting said binary output signal of N bits;

wherein said encoder unit directly converts the code according to a thermometric-binary code conversion equation expressed by Boolean algebra, without forming intermediate code and without having dependence among the bits of said binary output signal, wherein said encoder unit comprises multi-input-three-value-output logic circuits of a number of $(2^N-1)$ arranged like a pyramid with a position corresponding to a $(2^N-1)$-th bit of said encode signal as a vertex in order to realize said thermometric-binary code conversion equation.

11. A thermometric-binary code conversion circuit according to claim 10, wherein said multi-input-three-value-output logic circuit is a multi-input-three-value output logic circuit using a complementary logic circuit.

12. A thermometric-binary code conversion circuit according to claim 10, wherein said multi-input-three-value-output logic circuit is a multi-input-three-value output logic circuit using a pass transistor logic circuit.

13. A thermometric-binary code conversion circuit for converting the code of a thermometric input signal over a range from $(2^N-2)$ bits to $2^N-1$ bits into a binary output signal of N (N is an integer of 2 or larger) bits, comprising:

an input unit for receiving said thermometric input signal and for outputting an encode input signal of $(2^N-1)$ bits;

an encoder unit for receiving said encode input signal of $(2^N-1)$ bits and for outputting an encoded output signal of N bits; and an output unit for receiving said encoded output signal of N bits and for outputting said binary output signal of N bits;

wherein said encoder unit directly converts the code according to a thermometric-binary code conversion equation expressed by Boolean algebra, without forming intermediate code and without having dependence among the bits of said binary output signal, wherein said encoder unit comprises multi-input-three-value-output logic circuits of a number of $(2^N-1)$ arranged like a pyramid with a position corresponding to a ($2^N$–1)-th bit of said encode input signal as a vertex in order to realize said thermometric-binary code conversion equation.

14. A thermometric-binary code conversion circuit according to claim 13, wherein each said multi-input-three-value-output logic circuit is a multi-input-three-value output logic circuit using a complementary logic circuit.

15. A thermometric-binary code conversion circuit according to claim 13, wherein each said multi-input-three-value-output logic circuit is a multi-input-three-value output logic circuit using a pass transistor logic circuit.

16. A thermometric-binary code conversion circuit according to claim 13, wherein said input unit is provided for accomplishing the matching when said thermometric input signal is not in match in regard to time, potential or number of signals.

17. A thermometric-binary code conversion circuit for converting the code of a thermometric input signal of ($2^N$–1) bits into a binary output signal of K (K is an integer of not smaller than (N+1) and N is an integer of 2 or more) bits, comprising:

an input unit for receiving said thermometric input signal of ($2^N$–1) bits and for outputting an encode input signal of ($2^N$–1) bits;

an encoder unit for receiving said encode input signal of ($2^N$–1) bits and for outputting an encoded output signal of N bits; and an output unit for receiving said encoded output signal of N bits and for outputting said binary output signal of K bits;

wherein said encoder unit directly converts the code according to a thermometric-binary code conversion equation expressed by Boolean algebra, without forming intermediate code and without having dependence among the bits of said binary output signal, wherein said encoder unit comprises multi-input-three-value-output logic circuits of a number of ($2^N$–1) arranged like a pyramid with a position corresponding to a ($2^{N-1}$)-th bit of said encode input signal as a vertex in order to realize said thermometric-binary code conversion equation.

18. A thermometric-binary code conversion circuit according to claim 17, wherein said multi-input-three-value-output logic circuit is a multi-input-three-value output logic circuit using a complementary logic circuit.

19. A thermometric-binary code conversion circuit according to claim 17, wherein said multi-input-three-value-output logic circuit is a multi-input-three-value output logic circuit using a pass transistor logic circuit.

20. A thermometric-binary code conversion circuit according to claim 17, wherein said output unit is provided for accomplishing the matching when said binary output signal is not in match in regard to time, potential or number of signals for a device or a logic circuit of the next stage provided for receiving said binary output signals.

21. A encoder circuit for converting the code of a 7-bit thermometric input signal consisting of first to seventh of bits into a 3-bit binary output signal consisting of first to third bits, comprising:

an input unit including first to third input inverters for receiving said thermometric input signal and for outputting an encode input signal;

an encoder unit including first to seventh encoder element circuits for receiving said encode input signal and for outputting an encoded output signal; and an output unit including first to third output inverters for receiving said encoded output signal for outputting said binary output signal, wherein said first input inverter inverts the second bit of said thermometric input signal and outputs a second inverted bit thereof, said second input inverter inverts the fourth bit of said thermometric input signal and outputs a fourth inverted bit thereof, said third input inverter inverts the sixth bit of said thermometric input signal and outputs a sixth inverted bit thereof, and said input unit outputs the first to seventh bits of said thermometric input signal, said second inverted bit, said fourth inverted bit and said sixth inverted bit, collectively as said encode input signals.

22. An encoder circuit according to claim 21, wherein:

each of said first to seventh encoder element circuits includes a first inverted input terminal, a second input terminal, a third inverted input terminal, and an inverted output terminal;

said first encoder element circuit being supplied with a potential GND through its first inverted input terminal, being served with the fourth bit of said thermometric input signal through its second input terminal, and being supplied with the potential VDD through its third inverted input terminal;

said second encoder element circuit being served with the fourth inverted bit of said thermometric input signal through its first inverted input terminal, being served with the second bit of said thermometric input signal through its second input terminal, and being supplied with the potential VDD through its third inverted input terminal;

said third encoder element circuit being served with the potential GND through its first inverted input terminal, being served with the sixth bit of said thermometric input signal through its second input terminal, and being served with the fourth inverted bit of said thermometric input signal through its third inverted input terminal;

the inverted output terminal of said second encoder element circuit and the inverted output terminal of said third encoder element circuit being connected together;

said fourth encoder element circuit being served with the second inverted bit of said thermometric input signal through its first inverted input terminal, being served with the first bit of said thermometric input signal through its second input terminal, and being supplied with the potential VDD through its third invested input terminal;

said first encoder element circuit being served with the fourth inverted bit of said thermometric input signal through its first inverted input terminal, being served with the third bit of said thermometric input signal through its second input terminal, and being served with the second inverted bit of said thermometric input signal through its third inverted input terminal;

said sixth encoder element circuit being served with the sixth inverted bit of said thermometric input signal through its first inverted input terminal, being served with the fifth bit of said thermometric input signal through its second input terminal, and being served with the fourth inverted bit of said thermometric input signal through its third inverted input terminal;

said seventh encoder element circuit being served with the potential GND through its first inverted input terminal, being served with the seventh bit of said thermometric input signal through its second input terminal, and being served with the sixth inverted bit of said thermometric input signal through its third inverted input terminal; and the inverted output terminals of said fourth to seventh encoder element circuits being connected together.

23. An encoder circuit according to claim 22, wherein:

each of said first to seventh encoder element circuits is constituted by first and second P-channel transistors connected in series between said potential VDD and said inverted output terminal, and by first and second N-channel transistors connected in series between said inverted output terminal and said potential GND;

the gate electrodes of said first P-channel transistor and said second N-channel transistor connected at a position close to the power source, being connected in common to said second input terminal; and the gate electrodes of said second P-channel transistor and said first N-channel transistor connected at a position close to said inverted output terminal, being connected to said first inverted input terminal and to said third inverted input terminal, respectively.

24. An encoder circuit according to claim 22, wherein:

said first output inverter has its input terminal connected to the inverted output terminal of said first encoder element circuit, and outputs the first bit of said binary output signal from the output terminal thereof;

said second output inverter having its input terminal connected to the inverted output terminals of said second and third encoder element circuits, and outputs the second bit of said binary output signal from the output terminal thereof; and said third output inverter having its input terminal connected to the inverted output terminals of said fourth to said seventh encoder element circuits, and outputs the third bit of said binary output signal from the output terminal thereof.

25. An encoder circuit for converting the code of a 7-bit thermometric input signal consisting of first to seventh bits into a 3-bit binary output signal consisting of first to third bits, comprising:

an input unit including first to seventh input inverters for receiving said thermometric input signal and for outputting an encode input signal; and an encoder unit including first to seventh encoder element circuits for receiving said encode input signal and for outputting said binary output signal, wherein said first to seventh input inverters invert first to seventh bits of said thermometric input signal, and output first to seventh inverted bits, and said input unit outputs, collectively as said encode input signal, first to seventh bits of said thermometric input signal and first to seventh inverted bits of said thermometric input signal.

26. An encoder circuit according to claim 25 wherein:

each of said first to seventh encoder element circuits includes a first input terminal, a second input terminal, a second inverted input terminal, a third input terminal, and an output terminal;

said first encoder element circuit being supplied with the potential VDD through its first input terminal, being served with the fourth bit of said thermometric input signal through its second input terminal, being served with the fourth inverted bit of said thermometric input signal through its second inverted input terminal, and being supplied with the potential GND through its third input terminal;

said first encoder element circuit outputting a first bit of said binary output signal from the output terminal thereof;

said second encoder element circuit being served with the fourth inverted bit of said thermometric input signal through its first input terminal, being served with the second bit of said thermometric input signal through its second input terminal, being served with the second inverted bit of said thermometric input signal through its second inverted input terminal, and being supplied with the potential GND through its third input terminal;

said third encoder element circuit being supplied with the potential GND through its first input terminal, being served with the sixth bit of said thermometric input signal through its second input terminal, being served with the sixth inverted bit of said thermometric input signal through its second inverted input terminal, and being served with the fourth inverted bit of said thermometric input signal through its third input terminal;

the output terminal of said second encoder element circuit and the output terminal of said third encoder element circuit being connected together to output a second bit of said binary output signal;

said fourth encoder element circuit being served with the second inverted bit of said thermometric input signal through its first input terminal, being served with the first bit of said thermometric input signal through its second input terminal, being served with the first inverted bit of said thermometric input signal through its second inverted input terminal, and being supplied with the potential GND through its third input terminal;

said fifth encoder element circuit being served with the fourth inverted bit of said thermometric input signal through its first input terminal, being served with the third bit of said thermometric input signal through its second input terminal, being served with the third inverted bit of said thermometric input signal through its second inverted input terminal, and being served with the second inverted bit of said thermometric input signal through its third input terminal;

said sixth encoder element circuit being served with the sixth inverted bit of said thermometric input signal through its first input terminal, being served with the fifth bit of said thermometric input signal through its second input terminal, being served with the fifth inverted bit of said thermometric input signal through its second inverted input terminal, and being served with the fourth inverted bit of said thermometric input signal through its third input terminal;

said seventh encoder element circuit being supplied with the potential VDD through its first input terminal, being served with the seventh bit of said thermometric input signal through its second input terminal, being served with the seventh inverted bit of said thermometric input signal through its second inverted input terminal, and being served with the sixth inverted bit of said thermometric input signal through its third input terminal; and the output terminals of said fourth to seventh encoder element circuits being connected together to output a third bit of said binary output signal.

27. An encoder circuit according to claim 26, wherein:

each of said first to seventh encoder element circuits includes first and second P-channel transistors connected in series between said output terminal and said second input terminal, and first and second N-channel transistors connected in series between said output terminal and said second input terminal;

said series-connected first and second P-channel transistors and said series-connected first and second N-channel transistors being connected in parallel between said output terminal and said second input terminal; and the gate electrode of said first N-channel transistor connected to said output terminal being connected to said first input terminal, the gate electrode of said first P-channel transistor connected to said output terminal being connected to said third input terminal, and the gate electrodes of said second P-channel transistor and said second N-channel transistor connected to said second input terminal, being connected in common to said second inverted input terminal.

28. An encoder element circuit:

having a first inverted input terminal, a second input terminal, a third inverted input terminal and an inverted output terminal; and including first and second P-channel transistors connected in series between a potential VDD and said inverted output terminal, and first and second N-channel transistors connected in series between said inverted output terminal and the potential GND;

each of the gate electrodes of said first P-channel transistor and said second N-channel transistor connected at a position close to a power source, being connected in common to said second input terminal; and the gate electrodes of said P-channel transistor and said first N-channel transistor connected at a position close to said inverted output terminal, being connected to said first inverted input terminal and to said third inverted input terminal, respectively.

29. An encoder element circuit:

having a first input terminal, a second input terminal, a second inverted input terminal, a third input terminal and an output terminal; and including first and second P-channel transistors connected in series between said output terminal and said second input terminal, and first and second N-channel transistors connected in series between said output terminal and said second input terminal;

said series-connected first and second P-channel transistors and said first and second N-channel transistors being connected in parallel between said output terminal and said second input terminal;

the gate electrode of said first N-channel transistor connected to said output terminal being connected to said first input terminal, the gate electrode of said first P-channel transistor connected to said output terminal being connected to said third input terminal, and the gate electrodes of said second P-channel transistor and said second N-channel transistor connected to said second input terminal, being connected in common to said second inverted input terminal.

* * * * *